United States Patent [19]

Itoh et al.

[11] Patent Number: 4,920,405
[45] Date of Patent: Apr. 24, 1990

[54] OVERCURRENT LIMITING SEMICONDUCTOR DEVICE

[75] Inventors: Shinichi Itoh; Hisao Shigekane, Kawasaki, both of Japan

[73] Assignee: Fuji Electric Co., Ltd., Kanagawa, Japan

[21] Appl. No.: 125,688

[22] Filed: Nov. 25, 1987

[30] Foreign Application Priority Data

Nov. 28, 1986 [JP] Japan .................................. 61-283533
Feb. 5, 1987 [JP] Japan .................................. 62-25059

[51] Int. Cl.⁵ .................... H01L 23/02; H01L 23/12; H01L 23/16; H01L 23/28
[52] U.S. Cl. ........................................ 357/74; 357/72; 357/75; 357/76
[58] Field of Search ........................ 357/74, 75, 76, 72

[56] References Cited

U.S. PATENT DOCUMENTS

| | | | |
|---|---|---|---|
| 2,817,048 | 12/1957 | Thuermel et al. | 357/75 |
| 3,179,855 | 4/1965 | Brombaugh | 357/75 |
| 3,575,678 | 4/1971 | Barton | 357/75 |
| 3,715,633 | 2/1973 | Nier | 357/75 |
| 3,784,725 | 1/1974 | Perkins et al. | 357/75 |
| 4,430,664 | 2/1984 | Matsunaga et al. | 357/76 |
| 4,639,759 | 1/1987 | Neidig et al. | 357/75 |

FOREIGN PATENT DOCUMENTS

| | | | |
|---|---|---|---|
| 81313 | 5/1983 | Japan . | |
| 0215762 | 12/1984 | Japan | 357/75 |
| 0229849 | 12/1984 | Japan | 357/74 |

Primary Examiner—Eugene R. LaRoche
Assistant Examiner—Michael B. Shingleton
Attorney, Agent, or Firm—Stevens, Davis, Miller & Mosher

[57] ABSTRACT

An overcurrent limiting semiconductor device is provided comprising: a package having a base plate, sidewalls and a cover plate, at least one transistor fixed onto the base plate, terminal conductors respectively connected to the base, emitter and collector electrodes of the transistor which are led out through the cover plate, and a plurality of diode connected in series across the base/emitter of the transistor, with the diodes being disposed in a space provided between the cover plate and the base plate of the package, and connected to the base and emitter terminal conductors. This construction provides an integral overcurrent limiting semiconductor device which minimizes unnecessary limiting of the transistor collector-emitter current caused by a heating of the diodes by the transistor.

11 Claims, 2 Drawing Sheets

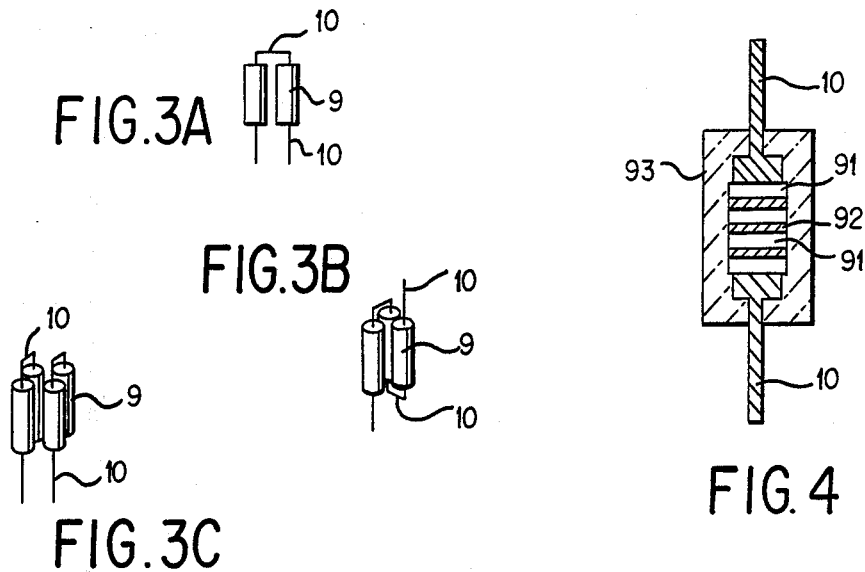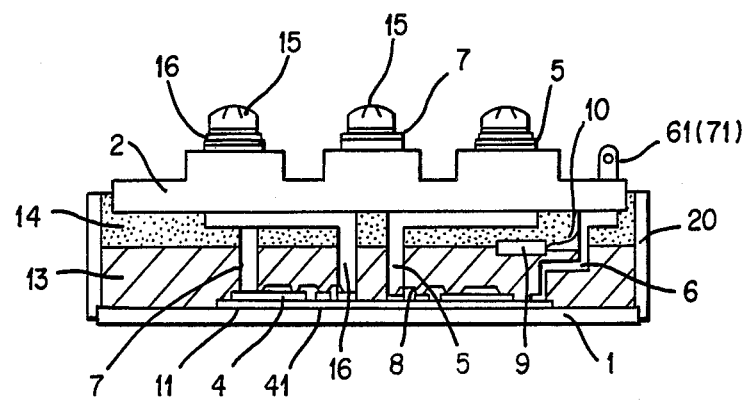

OVERCURRENT LIMITING SEMICONDUCTOR DEVICE

BACKGROUND OF THE INVENTION

1. Field of the Invention

The present invention relates to an overcurrent limiting semiconductor device for preventing an overcurrent from flowing across the collector/emitter junction of a transistor.

2. Discussion of the Prior Art

The use of a pair of diodes serially connected across the base/emitter conductors of a transistor is one known way to limit emitter current to less than a predetermined value. Such an arrangement is described in Japanese Patent Application (OPI) No. 81313/83, and is depicted in FIG. 2 of the present application. As shown in FIG. 2, a pair of diodes 22, 23 are serially connected across the base/emitter of a transistor 21, to limit the emitter current of the transistor 21. When current $I_R$ flowing through a resistor 24 having a resistance value R increases to cause the sum of the voltage ($R \cdot I_R$) and the voltage $V_{BE}$ across the base/emitter of the transistor 21 to be greater than that of the forward voltages of the diodes 22, 23, a current $I_1$ flows to hold the following relation, $$I_o = I_R - I_1$$

and $I_R$ is thus limited.

Even when transistors are coupled by a Darlington connection, diodes like those identified as 22, 23 are inserted between the base of a preceding stage transistor and the emitter of a final stage transistor. In this case, however, the number of diodes in series is selected to be greater by 1 or 2 than the number of the base/emitter junctions of the transistors.

As a practical matter, it is difficult to connect the overcurrent limiting diodes 22, 23 to external base and emitter terminals of a transistor when overcurrent protection is desired. Consequently, attempts have been made to incorporate the diodes into the same package containing the transistor. However, because the temperature coefficient of the resistor 24 is positive while that of the forward voltages of the diodes 22, 23 is negative, the temperatures of the diodes rise, causing their forward voltages to decrease, as the temperature of the transistor being energized rises, if the diodes are fitted onto the same heat radiation material as used for the transistor, or otherwise combined with the same semiconductor substrate for the transistor. On the other hand, the resistance value R of the resistor 24 increases because its temperature increases by the heat radiated from the transistor, thus excessively limiting the current. In order to prevent the temperature of the diodes from rising simultaneously as the temperature of the transistor rises, heat insulation should be provided between the diodes and the transistor on the base plate of the package, or otherwise the distance between them should be increased. However, the problem is that the package tends to become large, thus restricting the usage of such a device or increasing manufacturing cost.

SUMMARY OF THE INVENTION

The present invention is intended to solve the foregoing problems.

An object of the invention is to provide an overcurrent limiting semiconductor device wherein a plurality of diodes connected across the emitter/base of a transistor are incorporated in the same package which contains the transistor, without increasing the size of the package, while preventing the temperatures of the diodes from rising as the temperature of the tansistor rises.

In order to accomplish this object, an overcurrent limiting semiconductor device is provided comprising: a package having a base plate, sidewalls and a cover plate, at least one transistor fixed onto the baseplate, terminal conductors respectively connected to the base, emitter and collector electrodes of the transistor which are led out through the cover plate, and a plurality of diodes connected in series across the base/emitter of a transistor, with the diodes being disposed in a space provided between the over plate and the base plate of the package, and connected to the base and emitter terminal conductors. Preferably the transistor is in the form of a transistor chip.

The space between the base plate and the cover plate of the package formed with the base plate, sidewalls and the cover plate is normally filled with insulating resin which makes it unnecessary to increase the size of the package to arrange the diodes therein. The transmission of heat from the transistor chip on the base plate to each diode is such that it is ignorable, and the collector-emitter current is kept from being excessively limited. The use of a discrete lead-mount type diode for the current limiting diodes makes it possible to connect each such diode to a terminal conductor or otherwise connect the diodes to each other. Moreover, the package volume occupied by the diodes can be minimized even though the series number of diodes is large, by bending the lead interconnecting series diodes and arranging the diodes in parallel and in side-touching relationship. Alternatively, the diodes can be formed as a series of stacked and interconnected diode chips, with the end chips being connected to respective leads.

BRIEF DESCRIPTION OF THE DRAWINGS

The above and other objects, advantages and features of the invention can be more readily understood from the following detailed description of the invention which is provided in connection with the accompanying drawings, in which:

FIGS. 3(*a*), (*b*), and (*c*) are embodiments of overcurrent limiting diodes used in the invention, with FIG. 3(*a*) being an elevational view, and FIGS. 3(*b*), (*c*) being perspective views thereof;

FIG. 4 is another sectional view of another overcurrent limiting diode embodying the present invention; and FIG. 5 is a sectional view of another embodiment of the present invention.

DETAILED DESCRIPTION OF THE INVENTION

Figure 1:
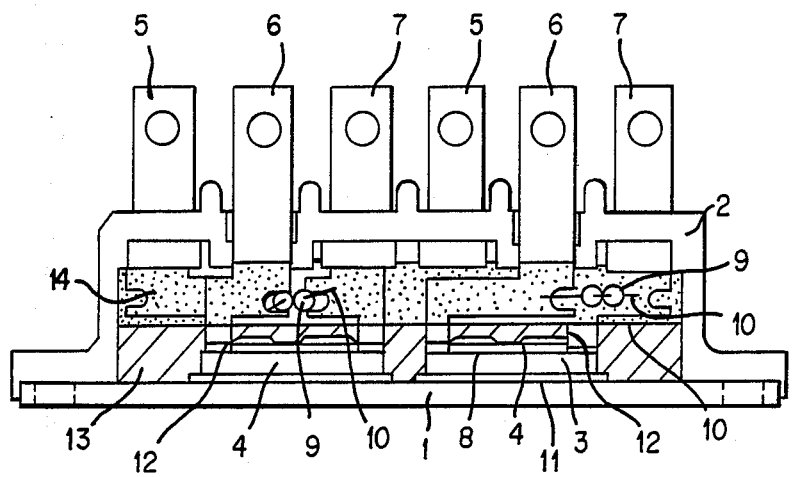
FIG. 1 is a sectional view of an embodiment of the present invention.
Figure 2:
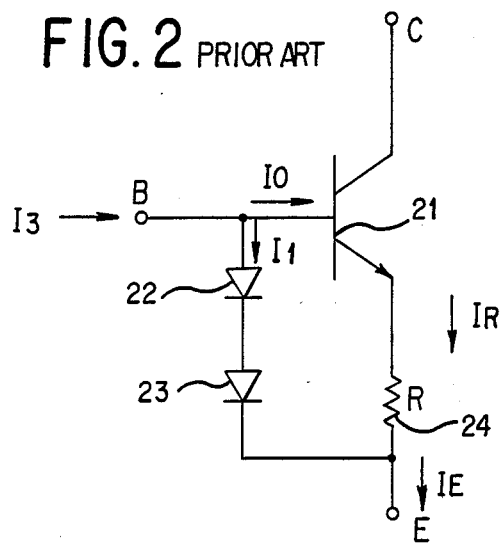
FIG. 2 is an equivalent circuit diagram of an overcurrent limiting semiconductor device.

FIG. 1 is a sectional view of one embodiment of the present invention. As shown in FIG. 1 a package consists of a base plate 1 of copper and a cover 2 prepared from insulating material, the cover being used simultaneouly as sidewalls and a cover plate. A plurality of heat sinks 3, each secured via a thin ceramic insulating plate 11 to the base plate 1 are provided, and respective transistor chips 4 are soldered onto the heat sinks 3. Pairs of collector terminal conductors 5, base terminal conductors 6 and emitter terminal conductors 7 are respectively passed through the cover 2, each of the conductors having a lower bent end. The collector terminal conductor 5 is directly connected to the heat sink 3, whereas the base terminal conductor 6 and the emitter terminal conductor 7 are secured via an insulting plate 12 onto the heat sink 3 and connected to the base electrode and the emitter electrode of the transistor chip 4 with an aluminum wire 8. Further, lead-mount type diodes 9 encapsulated for insulation are connected in series with a lead 10, which is also used to connect the diodes to the base terminal conductor 6 and the emitter terminal conductor 7. Silicon resin 13 is injected into the package to cover the transistor chips 4 and epoxy resin 14 is injected on the silicon resin, the diodes 9 being enclosed in the epoxy resin 14. The diodes 9 are connected in series in the manner shown in FIG. 3(a) wherein the lead 10 between successive diodes is bent and connected to the resin-molded diodes which are set close to each other, e.g., side-touching, in parallel, so that a compact arrangement is realized. FIG. 3(a) shows two diodes connected in series, but three of four diodes 9 may also be connected in series as shown in FIG. 3(b) or 3(c). In order to make the arrangement of diodes more compact, all of the diodes are grouped in side-by-side parallel relationship and placed in a heat-shrinkable tube and held together by the shrunk tube. Moreover, an even more compact arrangement is possible, as shown in FIG. 4, if diode chips 91 are used. With this construction the diode chips 91 are laminated together using soldering material 92 with leads respectively fitted to both ends of the laminate, with the chips 91 then being commonly encapsulated in a resin-molded body 92 to form a lead-mount type laminated diode. In this case, no lead interconnecting the diodes in series is required.

FIG. 5 shows another embodiment of the present invention, wherein like reference characters designate like parts of FIG. 1. As shown in FIG. 5, sidewalls 20 are bonded to a base plate 1 of copper and a cover plate 2 different from the base plate covers the upper portion of a semiconductor device. An insulating plate 11 is soldered onto the base plate 1, and transistor chips 4 and fry wheeling diode chips 41 are secured to conductive regions (not shown) formed on the insulating plate 11, respectively. The fry wheeling diode chip 41 is to be connected across the emitter/collector of the respective transistor 4 and, as shown in FIG. 5, is connected between a collector terminal conductor 5 and an emitter electrode of the transistor chip 4 by an aluminum wire 8. An emitter terminal of one transistor chip 4 is simultaneously used as a collector terminal of the other transistor chip 4. Reference numeral 16 designates a collector/emitter terminal. The collector terminal conductor 5, an emitter terminal conductor 7 and the collector/emitter terminal 16 are connected to an external conductor with a screw 15. However, a base terminal conductor 6 and an emitter controlling terminal are led out from the cover plater to form a base controlling terminal 61 and an emitter controlling terminal 71 and, connected to an external control circuit. A plurality of overcurrent limiting diodes 9 connected in series are connected between the base and emitter terminal conductors 61 and 71 led out by the control terminals with a lead 10.

According to the present invention, the overcurrent limiting diodes are located in a space provided between the base plate and the cover plate of the package and are thus separated from the transistor, which is a heat source. Accordingly, the current $I_R$ is prevented from being excessively limited as the temperature of the transistor rises, because the rise in the temperature of each diode caused by the temperature use of the transistor is minimized. Moreover, massproduced lead-mount type diodes are used with the lead bent to provide a compact arrangement of a plurality of diodes, or a lead-mount type diode prepared by integrally encapsulating laminated diode chips may be used, so that the diodes are contained in an overall semiconductor device package similar in dimensions to what is conventionally used.

While preferred embodiments of the invention have been described and illustrated, it should be apparent that many modifications can be made without departing from the spirit and scope of the invention. Accordingly, the invention is not limited by the foregoing description, but is only limited by the scope of the appended claims.

We claim:

1. An overcurrent limiting semiconductor device comprising:
   a package formed with a base plate, sidewalls and a cover plate;
   at least one transistor fixed onto said base plate;
   an encapsulation layer comprising a first resin layer formed on said base plate and a second resin layer formed on said first resin layer, said first resin layer and said second resin layer being made of different materials;
   terminal conductors respectively connected to the base, emitter and collector electrodes of said transistor, and being led out through the cover plate; and,
   a plurality of diodes electrically connected in series across base and emitter terminal conductors of said transistor, said being located in a space provided between said cover plate and said base plate of said package and being connected to the base and emitter terminal conductor of said transistor, said diodes comprising overcurrent limiting diodes enclosed in said second resin layer.

2. An overcurrent limiting semiconductor device as claimed in claim 1, wherein said diodes are lead-mount type diodes, which are connected to each other and to the base and emitter terminal conductors by means of leads.

3. An overcurrent limiting semiconductor device as claimed in claim 1, wherein said diodes are positioned in parallel and in close proximity to each other and electrical leads interconnecting said diodes are bent.

4. An overcurrent limiting semiconductor device as claimed in claim 3, wherein said diodes are in a side-touching relationship.

5. An overcurrent limiting semiconductor device as claimed in claim 2, further comprising means for holding said diodes together.

6. An overcurrent limiting semiconductor device as claimed in claim 5, wherein said holding means is a heat shrinkable tubing.

7. An overcurrent limiting semiconductor device as claimed in claim 2, wherein said diodes are positioned in parallel and in close proximity to each other and electrical leads interconnecting said diodes are bent.

8. An overcurrent limiting semiconductor device as claimed in claim 1, wherein said diodes positioned in parallel and in close proximity to each other and electrical leads interconnecting said diodes are bent.

9. An overcurrent limiting semiconductor device as claimed in claim 1, wherein said diodes are in the form of a plurality of stacked and serially connected diode chips, which are commonly encapsulated and connected to the base and emitter terminal conductors by means of leads extending out of the encapsulation.

10. An overcurrent limiting semiconductor device as claimed in claim 1, wherein said transistor is in the form of a transistor chip.

11. An overcurrent limiting semiconductor device according to claim 1, wherein said first resin layer is made of silicon and said second resin layer is made of epoxy.

* * * * *